(12) United States Patent
Barson

(10) Patent No.: US 9,014,400 B2
(45) Date of Patent: Apr. 21, 2015

(54) APPARATUS AND METHOD OF SILENT MONITORING ALARM SOUNDERS

(71) Applicant: Honeywell International Inc., Morristown, NJ (US)

(72) Inventor: Michael Barson, Nuneaton (GB)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/975,789

(22) Filed: Aug. 26, 2013

(65) Prior Publication Data

US 2015/0055786 A1    Feb. 26, 2015

(51) Int. Cl.
| | |
|---|---|
| H04R 1/00 | (2006.01) |
| H04R 29/00 | (2006.01) |
| H04R 25/00 | (2006.01) |
| G08B 29/10 | (2006.01) |
| H04R 17/00 | (2006.01) |
| H03F 3/217 | (2006.01) |

(52) U.S. Cl.
CPC .............. *G08B 29/10* (2013.01); *H04R 29/001* (2013.01); *H04R 17/00* (2013.01); *H03F 3/217* (2013.01)

(58) Field of Classification Search
CPC ...... H04R 27/00; H04R 29/00; H04R 29/001; H04R 29/004; H04R 29/007; H04R 3/00; H04R 3/04; H04R 3/12; H04R 17/00; H04R 17/02; H04R 17/005; H04R 2217/00; H04R 2217/01

USPC .................. 381/58, 59, 114, 173, 174, 190
See application file for complete search history.

(56) References Cited

U.S. PATENT DOCUMENTS

| | | | | |
|---|---|---|---|---|
| 6,309,711 | B1 * | 10/2001 | Tseng et al. ................... | 427/474 |
| 6,617,967 | B2 * | 9/2003 | Baldwin et al. ............. | 340/384.6 |
| 2002/0126001 | A1 * | 9/2002 | Baldwin et al. ............. | 340/384.1 |
| 2003/0164658 | A1 * | 9/2003 | Saraf ............................ | 310/317 |
| 2003/0222535 | A1 * | 12/2003 | Gofman et al. .......... | 310/316.01 |
| 2006/0139152 | A1 * | 6/2006 | Keeler et al. ............... | 340/384.6 |
| 2007/0121969 | A1 * | 5/2007 | Mayazaki ..................... | 381/116 |
| 2008/0048841 | A1 * | 2/2008 | Keeler et al. ................. | 340/329 |

FOREIGN PATENT DOCUMENTS

GB    2 388 916 A    11/2003

* cited by examiner

*Primary Examiner* — Khai N Nguyen
(74) *Attorney, Agent, or Firm* — Husch Blackwell LLP

(57) ABSTRACT

An alarm sounder, which incorporates a piezo-electric output transducer, can be silently monitored using a variable frequency square wave. An initial frequency, close to the upper limit of human hearing, is coupled to the sounder. The transducer draws very little current at this initial frequency. The frequency of the square wave is systematically reduced, and the current draw is continually monitored. A high current indicates a low impedance type of fault. A low current throughout the frequency range indicates a potential high frequency type of fault.

20 Claims, 3 Drawing Sheets

APPARATUS AND METHOD OF SILENT MONITORING ALARM SOUNDERS

FIELD

The application pertains to audible alarm indicating output devices, or sounders. More particularly, the application pertains to substantially silent monitoring of alarm sounders.

BACKGROUND

Modern analogue addressable fire alarm systems use many loop powered alarm sounders controlled by microcontrollers, to alert people in protected areas to the presence of a fire alarm condition. Many alarm sounders use piezo-electric transducers (a piezo) to reduce the current consumption of the sounders in the alarm condition. Typically these analogue addressable systems can continuously monitor all outstation types on each addressable loop for faults, to ensure the system can be relied on to detect fires and alert people. In the case of alarm sounders, the actual sounder output can normally only be switched on and verified during regular tests with the system in the alarm state.

While it would be an enormous benefit to continuously verify that the alarm sounder can actually provide its correct output, background monitoring has always proved difficult to successfully implement especially with sounders using a piezo element. In known systems, complex monitoring waveforms need to be generated, so that background monitoring is normally only available on speech variants. However, as a relatively large acoustic output during the background monitoring has always proved to be unavoidable, its use in bedrooms for example, is clearly unacceptable.

One way to guarantee reliable fault detection of the sounder would be to require that the monitoring frequency be fixed at a relatively low in-band frequency. This configuration would produce a monitoring current high enough to provide reliable discrimination. This however would prevent the monitoring from being silent, and it would limit its general use.

DETAILED DESCRIPTION

Figure 1:
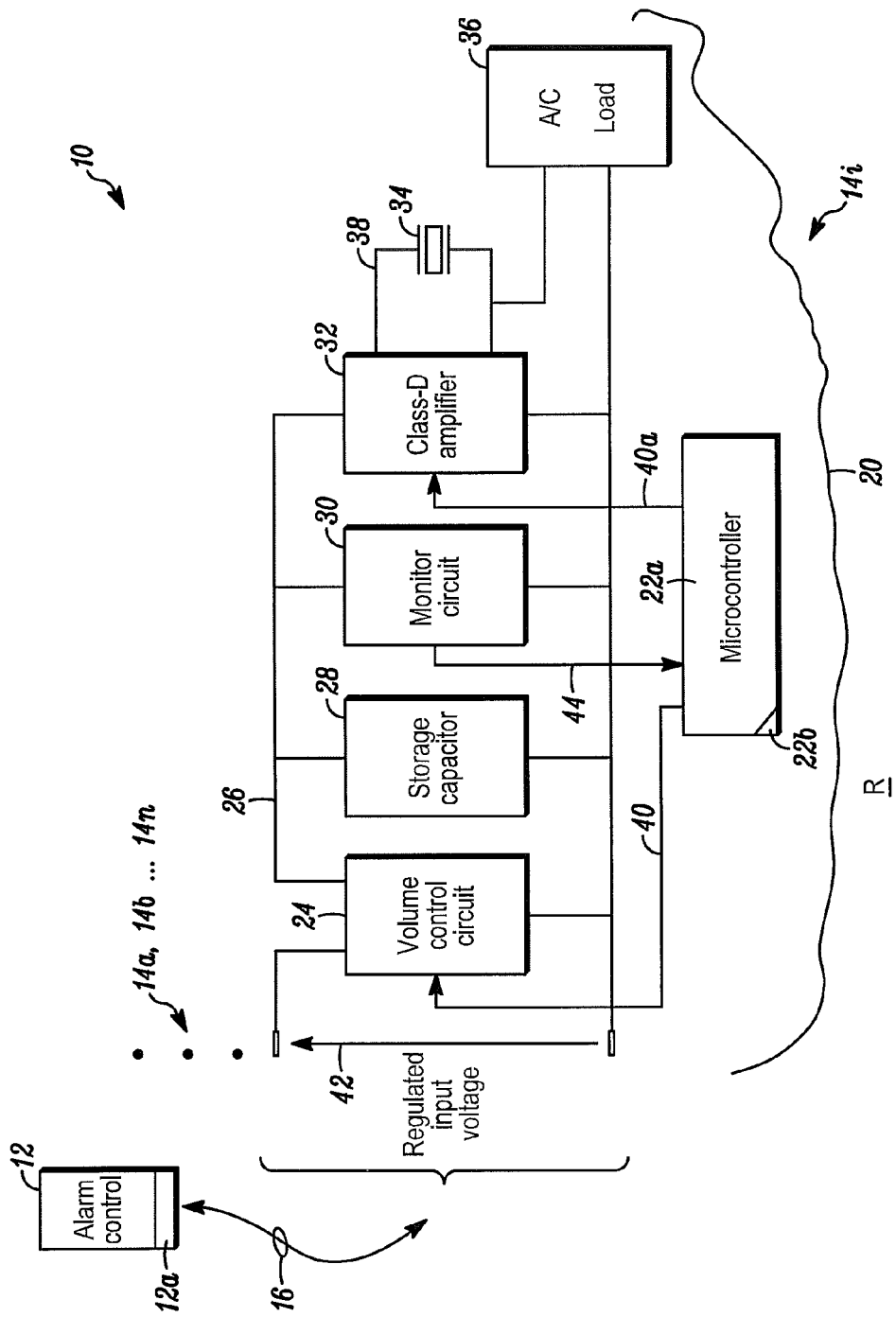
FIG. 1 is a block diagram of an embodiment hereof.

While disclosed embodiments can take many different forms, specific embodiments hereof are shown in the drawings and will be described herein in detail with the understanding that the present disclosure is to be considered as an exemplification of the principles hereof, as well as the best mode of practicing same, and is not intended to limit the claims hereof to the specific embodiment illustrated.

Silent monitoring, in accordance herewith can be provided for a fire alarm piezo-electric sounder that uses a class-D drive amplifier which normally produces attention tones between 500 Hz and 1 KHz. Significant higher harmonics are also normally produced through-out the audio band, and optionally, the sounder may be used to produce speech messages. The class-D amplifier uses the audio output providing piezo-electric transducer as a filtering capacitor. The volume is normally controlled by adjusting the supply voltage feed to a storage capacitor connected to the amplifier.

Silent monitoring can be implemented by periodically producing a high frequency square wave, starting at a frequency close to the upper limit of hearing of approximately 20 KHz. The amplifier is set to the maximum volume, and then the supply rail to the amplifier is turned off, allowing the amplifier to be energized by a local storage capacitor coupled to the supply rails.

Normally the amplifier will draw a small current due to the piezo being driven at a frequency far outside the speech band and higher than the upper corner frequency of the amplifier. This also causes the amplifier to attenuate the monitoring frequency so it becomes inaudible. The drop in voltage on the storage capacitor over a fixed period is directly proportional to the current used and is monitored by local control circuits, which could include a microcontroller, in the alarm sounder.

If the piezo element or, the amplifier draws a very high current, then this is clearly a low impedance type of fault and can easily be detected by the local control circuits as such. If the current is lower than expected, then this could be a high impedance type of fault; however it could also be due to the very high efficiency of the amplifier, the variation in its impedance at this high frequency or due to the component variation of the particular piezo element and storage capacitor used. While all the variations could be initially calibrated out during manufacturing, it is know that component values will change with the effects of temperature and age.

In one aspect hereof, the alarm sounder generates a square wave monitoring frequency at descending frequency steps below 20 KHz, with the transition between steps carefully controlled to minimise the audio content. If an adequate, but not excessive monitoring current can be detected at any step, then this process will stop and the test will have been passed, if however the current is always too small then the test will only stop and fail at a drive frequency well into the audio band.

The overall effect of this optimising technique is to produce a preferred monitoring frequency that will reliably monitor the sounder and give the lowest possible audio output and therefore annoyance. If an open circuit type of fault is discovered, the sounder will actually be tested at its maximum volume and at a drive frequency which is consistent with the sounder's normal operation during an alarm. In this case it is a certainty that a real fault must exists, however even this will be a silent test.

Figure 2:
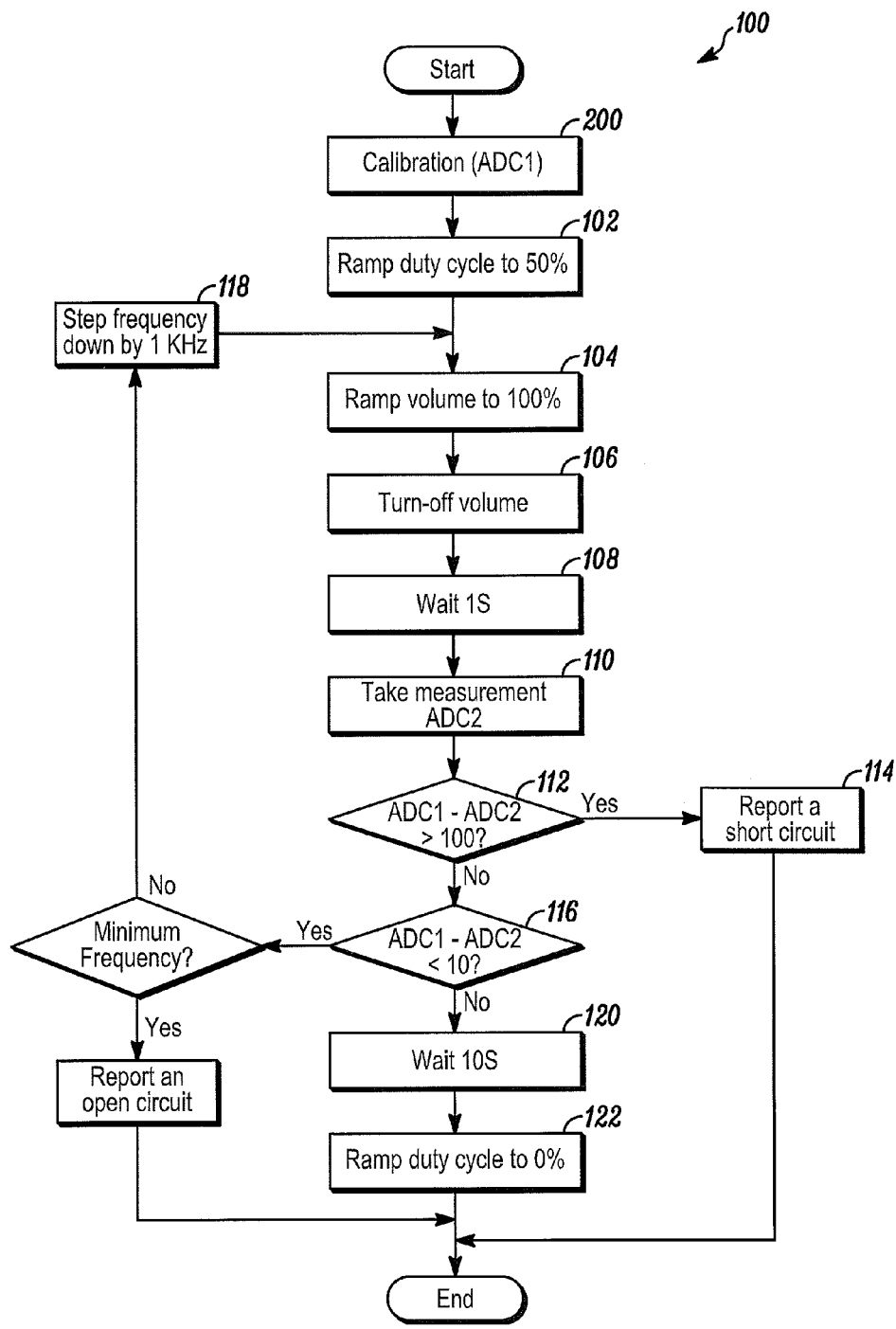
FIG. 2 is a flow diagram of aspects of operation of the embodiment of FIG. 1.
Figure 3:
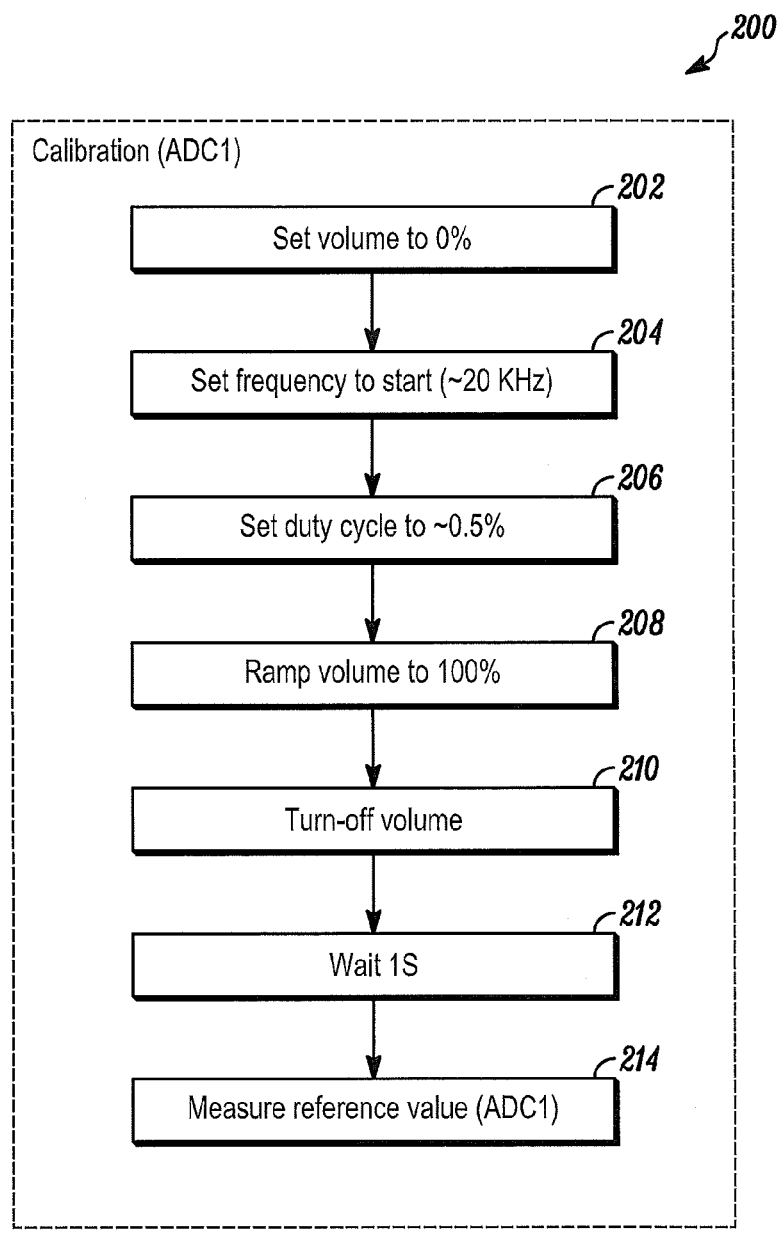
FIG. 3 is a flow diagram of additional aspects of the method of FIG. 2.

FIG. 1 illustrates a block diagram of an alarm/monitoring apparatus 10 which incorporates silent testing of one or more alarm sounders in accordance herewith. FIG. 2 and FIG. 3 illustrate aspects of methods 100, 200 respectively of testing such sounders.

Apparatus 10 includes an alarm/monitoring control unit, or panel 12 of a type generally known to those of skill in the art. The unit 12 is in bidirectional communication with a plurality 14 of substantially identical alarm sounders 14a, 14b . . . 14i . . . 14n via a medium 16. The medium 16 could be implemented, for example as an electric cable.

The unit 12 can communicate information and commands to and receive information from members of the plurality 14 along with smoke, fire, or intrusion detectors, without limitation as would be used in monitoring a region R and providing alarm related information to individuals in that region.

Sounder 14i is representative of members of the plurality 14. A description thereof will suffice for the other members of the plurality 14 as well.

Sounder 14i is carried by a housing 20 which could be mounted on a surface in the region R to provide audible alarm indicating outputs. Sounder 14*i* receives commands, and other information along with electrical energy from unit 12 via medium 16. Sounder 14*i* can also communicate status or test results to the unit 12 via medium 16 and interface circuits 12*a*. If desired, sounder 14*i* could be in wireless communication with unit 12 and receive its electrical energy from a local source, without limitation.

Housing 20 of sounder 14*i* carries a programmable control unit, or microcontroller, 22*a* along with pre-stored control software 22*b*. Housing 20 also carries volume control circuits 24, storage capacitor 28, monitoring circuitry 30, a class-D amplifier 32 a piezoelectric audible output transducer 34 and an A/C load 36.

In operation as discussed below, microcontroller 22*a* periodically background tests the alarm sounder 14*i* using a test signal when the alarm sounder is not active to determine if it is capable of giving an audio alarm when required. This test signal starts at an inaudible high initial frequency close to 20 KHz. First, the quiescent current taken by the class-D amplifier 32, the monitor circuitry 30 and the hold-up time of the storage capacitor 28 is measured in a calibration test 200 discussed further relative to FIG. 3.

The microcontroller 22*a* sets the volume to 0%, as at 202, using a PWM control line 40, which drives the volume control circuit 24. The volume control circuit 24 supplies a voltage supply level on line 26 to a class-D amplifier 32 and hence controls its volume. Microcontroller 22*a* then sets a PWM drive frequency, line 40*a*, to a very low duty cycle of just less than 0.5%, as at 206, at the initial start frequency of 20 KHz, as at 204. The audio envelope generated in this step change is masked by the fact that the volume is set to 0%.

The volume is then ramped up to its maximum 100% level, as at 208, using the PWM control line 40 over a number of seconds, so that the frequency content of the envelope appearing on the output of class-D amplifier 32 is too low to be audible. Storage capacitor 28 is now charged up to its maximum voltage, which is equal to the regulated input voltage 42 obtainable from the medium 16. Microcontroller 22*a* now turns off the volume control circuit 24, as at 210, by setting the PWM control line 40 to 0%.

Storage capacitor 28 now slowly discharges at a rate dependent on the actual value of the capacitor 28, the static circuit loading and the dynamic loading caused by the finite switching losses of the class-D amplifier 32. The piezoelectric transducer 34 causes almost no loading because of the very small duty cycle of the class-D amplifier 326.

After about a one second discharge period, as at 212, microcontroller 22*a* measures the monitor circuitry 30 using an analogue to digital converter connected to ADC port line 44, as at 214. This calibration reading is termed ADC1 and could be the result of a number of samples averaged together to filter noise. It should also be understood that this ADC1 value could also be checked to see if it is in an expected range, so that many other hardware faults could be determined.

With respect to FIG. 2, following on from the calibration test, of FIG. 3, the duty cycle of the initial test frequency is slowly increased to 50%, as at 102, to produce a square wave drive waveform and the volume is also slowly increased to a maximum 100%, as at 104, by the microcontroller 22*a*. In both cases the rate of change is limited so that the frequency content from the class-D amplifier 32 remains inaudible. The output of the class-D amplifier 32 is now at the maximum drive power for the piezoelectric transducer 34, for this particular frequency. Microcontroller 22*a* now turns off the volume control circuit 24, as at 106, so that storage capacitor 28 will discharge at a higher rate determined mainly by the loading from the piezoelectric transducer 34.

After about one second, as at 108, the microcontroller 22*a* measures the monitor circuitry 30 using an analogue to digital converter connected to the ADC port line 44. This reading is termed ADC2, as at 110, and may be the result of a number of samples averaged together.

A small NC load 36 may be placed asymmetrically on the piezoelectric transducer 34 to increase its high frequency loading and the class-D amplifier 32 may be driven only on the opposite side of the piezoelectric transducer 34, with a single ended output 38. The A/C load 36 could be just a capacitor, with a value that is small compared to the capacitance of the piezoelectric transducer.

Microcontroller 22*a* now removes the calibration value ADC1 from the first test measurement ADC2, giving a delta measurement to determine the load impedance of the alarm sounder. If the delta measurement is too high, as at 112, it indicates an excessively high current caused by a low impedance fault, either due to the piezoelectric transducer 34 or class-D amplifier 32 being faulty. Microcontroller 22*a* then reports back to the control panel 12 that a short-circuit fault exists on the alarm sounder 14*i*, as at 114.

If however the delta measurement is too low, it does not necessarily mean that an open circuit fault has occurred, it could be that the loading caused by the class-D amplifier 32 driving the piezoelectric transducer 34 at such a high frequency is just too small to measure reliably, as the test frequency is far outside the normal operational range of an alarm sounder, such as 14*i*.

If the delta measurement is too low, as at 116, then the microcontroller 22*a* goes through a process of reducing the test frequency by a small amount (say by 1 KHz) and repeating the above test measurement (as at 104-110) to obtain a new value of ADC2. As the test frequency moves closer to the normal operational frequency of the alarm sounder, then the load current taken by the class-D amplifier 32 due to the piezoelectric transducer 34 must increase if the alarm sounder is really fault free. The microcontroller 22*a* will then finish the silent monitoring when it detects that an open circuit does not exist. This will be at a frequency that exactly minimizes the audio output noise and maximizes the robustness of the measurement.

If however the delta measurement is too low on each new test frequency and the test frequency has reached the normal operational frequency range of the alarm sounder, say for example as low as 3 KHz, then at this minimum frequency it is certain that a real open circuit fault must exist and the microcontroller 22*a* will stop the test and report an open circuit fault to the control panel. Note that in this condition the monitoring has also remained silent even while the test frequency is well into the audio band and at its maximum volume.

Assuming a successful test of the alarm sounder resulted in no faults being found, then the square wave test frequency remains on for about ten seconds, as at 120, so that the storage capacitor 28 is fully discharged i.e. the class-D amplifier 32 falls to 0% volume, as at 122, before microcontroller 22*a* ramps the test frequency off to end the test. This process again ensures that the frequency content of the audio envelope is masked.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims. Further, logic flows depicted in the figures do not require the particular order shown, or sequential order, to achieve desirable results. Other steps may be provided, or steps may be eliminated, from the described flows, and other components may be add to, or removed from the described embodiments.

The invention claimed is:

1. An alarm sounder comprising:
   a housing;
   a class-D amplifier coupled to a piezo-electric transducer, the class-D amplifier and the piezo-electric transducer are carried in the housing; and
   control circuits coupled to the class-D amplifier that incorporate silent testing of the alarm sounder by coupling a monitoring waveform to the class-D amplifier at an initial, selected high frequency, with a low frequency signal envelope, substantially inaudible to human hearing and a plurality of descending frequencies with the transducer current being measured at each of the frequencies.

2. The alarm sounder as in claim 1 which communicates with a displaced regional monitoring control unit.

3. The alarm sounder as in claim 1 where the control circuits carry out an initial calibration process to establish a reference value.

4. The alarm sounder as in claim 1 where the process is terminated when a predetermined current value is detected, and, wherein a local capacitor provides a current flow to drive the class-D amplifier.

5. The alarm sounder as in claim 4 where the control circuits monitor a capacitor voltage over a period of time and establish a current flow therefrom.

6. The alarm sounder as in claim 1 where the control circuits include volume control circuits coupled to a storage capacitor.

7. The alarm sounder as in claim 6 where a decay time parameter of the storage capacitor is measured.

8. The alarm sounder as in claim 7 which includes increasing a duty cycle of a test signal which drives the piezo-electric transducer.

9. The alarm sounder as in claim 8 which includes increasing a volume parameter of the test cycle.

10. An alarm sounder comprising:
    a class-D amplifier that drives a piezoelectric transducer with a variable background monitoring waveform that is initially set at a first frequency which substantially exceeds an end of a predetermined audio band; and
    control circuits that periodically background test the piezo-electric transducer using the variable background monitoring waveform when the alarm sounder is not otherwise active to determine if the alarm sounder is capable of giving an audio alarm when required thereby incorporating silent testing of the alarm sounder.

11. The alarm sounder as in claim 10 where the waveform comprises a square wave.

12. The alarm sounder as in claim 11 which includes a capacitor where a voltage decay on the capacitor is indicative of the sounder monitoring current.

13. The alarm sounder as in claim 12 wherein the decaying voltage is monitored, at least intermittently, to measure an audio producing current of the alarm sounder.

14. The alarm sounder as in claim 13 where the waveform frequency is intermittently reduced while continuing to monitor the alarm sounder audio producing current.

15. A method of monitoring operation of a transducer comprising:
    a microcontroller generating a variable frequency square wave;
    the microcontroller driving a piezo-electric transducer with the square wave;
    the microcontroller monitoring a current of the piezo-electric transducer as the frequency is being varied; and
    the microcontroller determining if the current indicates expected operation of the piezo-electric transducer thereby incorporating silent testing of the piezo-electric transducer.

16. The method as in claim 15 where generating includes increasing a duty cycle parameter thereof.

17. The method as in claim 16 which includes increasing a volume parameter thereof.

18. The method as in claim 17 where determining includes at least one of detecting a short circuit, or detecting an open circuit.

19. The method as in claim 16 where generating includes initially producing the square wave in the vicinity of 20 KHz.

20. The method as in claim 19 which includes then setting an amplitude parameter of the square wave to a maximum value.

* * * * *